United States Patent
Satoh et al.

(10) Patent No.: US 6,782,614 B2
(45) Date of Patent: Aug. 31, 2004

(54) CONTACT PIN ASSEMBLY, CONTACT PIN ASSEMBLY MANUFACTURING METHOD, CONTACT PIN ASSEMBLING STRUCTURE, CONTACT PIN ASSEMBLING STRUCTURE MANUFACTURING METHOD, AND SOCKET FOR ELECTRICAL PARTS

(75) Inventors: Shuichi Satoh, Kawaguchi (JP); Masami Fukunaga, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 10/235,580

(22) Filed: Sep. 6, 2002

(65) Prior Publication Data

US 2003/0003782 A1 Jan. 2, 2003

Related U.S. Application Data

(62) Division of application No. 09/855,504, filed on May 16, 2001, now Pat. No. 6,575,767.

(30) Foreign Application Priority Data

May 17, 2000 (JP) ........................ 2000-145148

(51) Int. Cl.[7] .................... H05K 3/00; H01R 43/20
(52) U.S. Cl. ................... 29/842; 29/426.1; 29/426.5; 29/747; 29/825; 29/845
(58) Field of Search ..................... 29/874, 883, 882, 29/564.6, 825, 426.1, 426.5, 747, 842, 845

(56) References Cited

U.S. PATENT DOCUMENTS

| | | | |
|---|---|---|---|
| 3,990,767 A | * 11/1976 | Narozny | |
| 4,190,952 A | * 3/1980 | Thomas et al. | |
| 4,418,977 A | * 12/1983 | O'Shea, Jr. | |
| 4,428,637 A | * 1/1984 | Worth | |
| 4,442,594 A | * 4/1984 | Narozny | |
| 4,715,119 A | * 12/1987 | Joosten | |
| 4,952,529 A | * 8/1990 | Grider | |
| 5,055,777 A | 10/1991 | Bonelli | 324/158 |
| 5,247,250 A | 9/1993 | Rios | 324/158 |
| 5,475,921 A | * 12/1995 | Johnston | |
| 5,521,521 A | 5/1996 | Perego | 324/755 |
| 5,526,565 A | * 6/1996 | Roberts | |
| 5,611,696 A | 3/1997 | Donner et al. | 439/66 |
| 5,619,794 A | * 4/1997 | Hokazono | |
| 5,893,762 A | 4/1999 | Kajiwara et al. | 439/72 |
| 6,123,552 A | 9/2000 | Sakata et al. | 439/71 |
| 6,229,320 B1 | 5/2001 | Haseyama et al. | 324/754 |

* cited by examiner

*Primary Examiner*—Carl J. Arbes
(74) *Attorney, Agent, or Firm*—Staas & Halsey LLP

(57) ABSTRACT

A contact pin assembly for a socket for electrical parts comprises a plurality of contact pins provided for a socket body of a socket for electrical parts and a connection member, formed separately, connecting all the contact pins with a predetermined distance between adjacent ones. The predetermined distance is made substantially equal to a distance between adjacent ones of terminals provided for an electrical part which is held in the socket body.

25 Claims, 11 Drawing Sheets

PRIOR ART

CONTACT PIN ASSEMBLY, CONTACT PIN ASSEMBLY MANUFACTURING METHOD, CONTACT PIN ASSEMBLING STRUCTURE, CONTACT PIN ASSEMBLING STRUCTURE MANUFACTURING METHOD, AND SOCKET FOR ELECTRICAL PARTS

This application is a divisional of application Ser. No. 09/855,504, filed May 16, 2001, now U.S. Pat. No. 6,575,767.

BACKGROUND OF THE INVENTION

The present invention relates to a socket for an electrical part used for carrying out an electrical test of electrical parts such as electronic circuit board such as IC package and to parts or assembly constituting such socket.

PRIOR ART OF THE INVENTION

For example, in a case where a burn-in test of an IC package (electrical part) such as BGA or LGA, the IC package is accommodated in a socket for electrical parts provided with contact pins formed of electrically conductive metal, and terminals formed to the lower surface of the IC package in shape of matrix are contacted to the contact pins to thereby establish an electrical connection, through the contact pins, between the terminals of the IC package and an external test circuit means.

Recent technology has provided the following technical ideas as prior art.

[First Prior Art]

Recently, in an IC package such as BGA or LGA, there is a requirement of realizing a small or compact structure of the IC package, and for this reason, contact pins having various shapes have been provided. For instance, one example is shown in FIG. 15, in which a contact pin 70 comprises a tubular (cylindrical) member 71 formed of an electrically conductive metal, a rod-shape contact (contact piece) 72 which is formed of an electrically conductive metal and disposed inside the tubular member 71 to be vertically movable, and a spring 73 by which the contact 72 is urged upward so as to contact the contact 72 to a terminal 8 of an IC package 10 so that the terminal 8 of the IC package 10 contacts electrically to an external test circuit means, not shown, through the rod-shape contact 72 and the tubular member 71. The contact pins 70 each of such structure are mounted inside the socket (not shown) for electrical parts so as to accord in numbers with the terminals 8 of the IC package 10.

[Second Prior Art]

FIG. 16 also shows another example of a contact pin of conventional structure, and, the contact pin 75 is formed of an electrically conductive material in form of a coil spring, which has one end contacting a terminal 8 of an IC package 10 and the other end contacting an external test circuit means, not shown, so as to accommodate the contact pin 75 in the socket body in a manner opposing to the terminal 8 of the IC package 10.

However, the contact pin 70 of the first prior art has a complicated structure and, it is hence difficult to easily manufacture the same. Moreover, since the contact pin 70 is not easily manufactured, a price or selling cost of the contact pin as a product is made expensive. Accordingly, a socket for electrical parts provided with a number of such expensive contact pins are also made expensive.

On the other hand, the contact pin 75 has a simple structure in comparison with the first example, and hence, it is relatively easily manufactured with cheap cost of product. However, in this contact pin 75, as the electrically conductive material is formed in shape of spiral coil having a long length, a large resistance is provided, thus being defective.

Furthermore, in these first and second prior art examples (conventional contact pins 70 and 75), the contact pins 70 (75) must be mounted one by one to a contact pin accommodation portion of the socket body so as to be coincident with a number of terminals 8 of the IC package 10, requiring a troublesome mounting working, thus being not effective.

SUMMARY OF THE INVENTION

An object of the present invention is to substantially eliminate defects or drawbacks encountered in the prior art mentioned above and to provide a structural part or member for the socket for electrical parts and provide such socket capable of reducing assembling working or steps and manufacturing cost.

This and other objects of the present invention can be achieved by providing, in one aspect, a contact pin assembly for a socket for electrical parts comprising:

a plurality of contact pins provided for a socket body of a socket for electrical parts; and a connection member connecting all the contact pins with a predetermined distance between adjacent ones, the predetermined distance being made substantially equal to a distance between adjacent ones of terminals provided for an electrical part which is held in the socket body.

In a preferred example, each of the contact pins comprises a spring function portion having elasticity, a contact portion which is formed to a top end side of the spring function portion and contacts the terminal of the electrical part, a conductive portion extending from the spring function portion on the side opposite to the contact portion, and a connection leg portion further extending from the conductive portion, the conductive portions of the respective contact pins being connected together by the connection member.

The contact pins are arranged laterally symmetrically with respect to a center line of the contact pin arrangement and when the contact portions of the contact pins are contacted to the terminals and pressed thereby, the contact portions of the laterally arranged contact pins are displaced respectively to a center line side and a side opposite to the center line side.

In this aspect, there is further provided a method of manufacturing a contact pin assembly which comprises a plurality of contact pins and a connection member connecting all the contact pins, the manufacturing method comprising:

forming a plurality of contact pins and contact pin connection portions integrally from a conductive elastic plate member;

arranging and fixing the contact pins by using a connection member with a predetermined distance between adjacent ones; and removing thereafter the contact pin connection portions from the respective contact pins.

According to this aspect, since a plurality of contact pins are arranged with a predetermined distance (interval) by the connection member, the workability at the time of assembling to the socket for electrical parts can be improved.

The connection of the conductive portion between the spring function portion and the connection leg portion through the connection member does not give an adverse affect on the elastic deformation of the spring function portion and the connection of the connection leg portion to the external test circuit means.

Furthermore, according to the symmetric arrangement of the contact pins, when the contact pin assembly is incorporated in the socket and the contact portions of the contact pins are pressed by the terminals, the contact portions, separated into lateral two portions, are displaced in opposing directions from the center line of the contact pin arrangement. Therefore, the electrical part is not moved in one direction and good wiping effect can be achieved between the terminals of the electrical part and the contact portions of the contact pins.

Furthermore, according to the contact pin assembly manufacturing method of the above aspect, a plurality of contact pins can be extremely easily and exactly connected with a predetermined distance by using the connection member.

In another aspect of the present invention, there is also provided a contact pin assembling structure for a socket for electrical parts comprising:

a plurality of contact pins provided for a socket body of a socket for electrical parts, each of the contact pins comprising a spring function portion having elasticity, a contact portion which is formed to a top end side of the spring function portion and contacts the terminal of the electrical part, a conductive portion extending from the spring function portion on the side opposite to the contact portion, and a connection leg portion further extending from the conductive portion, the conductive portions of the respective contact pins being connected together by the connection member;

a connection member connecting all the contact pins with a predetermined distance between adjacent ones, the predetermined distance being made substantially equal to a distance between adjacent ones of terminals provided for an electrical part which is held in the socket body; and a contact pin holding member formed of an insulating resin material, the contact pin holding member holding and fixing together the conductive portion and the spring function portion and the conductive portion and the connection leg portion.

In this aspect, there is further provided a method of manufacturing a contact pin assembling structure defined above, wherein the conductive portion and the spring function portion of the contact pin and the conductive portion and the connection leg portion of the contact pin are fixed to the contact pin holding member formed of an insulating resin material and, thereafter, the connection member is removed from the conductive portions of the contact pins.

According to this aspect, the conductive portion and the spring function portion of the contact pin and the conductive portion and the connection leg portion of the contact pin are fixed to the contact pin holding member, respectively, so that the contact pins can be held with predetermined distance in a stable fashion without causing positional shifting of the contact pins.

In a further aspect of the present invention, there is also provided a socket for electrical parts in which a plurality of terminals provided for an electrical part are electrically connected to an external test circuit means through a plurality of contact pins arranged in accordance with the arrangement of the terminals, wherein a plurality of contact pin assembling structures each having the structure defined above are laminated in numbers corresponding to the number of rows of the terminals of the electrical part.

In a more specific mode in this aspect, there is provided a socket for electrical parts comprising:

a socket body formed of an insulating resin material;

a cover mounted to the socket body to be opened or closed;

a plurality of contact pin assembling structures mounted to the socket body; and a floating plate elastically supported by the socket body through a spring, the floating plate having a terminal accommodation portion in which terminals of an electrical part is accommodated, the plurality of contact pin assembling structures being laminated in numbers corresponding to the number of rows of the terminals of the electrical part, and each of the contact pin assembling structure comprising:

a plurality of contact pins provided for the socket body, each of the contact pins comprising a spring function portion having elasticity, a contact portion which is formed to a top end side of the spring function portion and contacts the terminal of the electrical part, a conductive portion extending from the spring function portion on the side opposite to the contact portion, and a connection leg portion further extending from the conductive portion, the conductive portions of the respective contact pins being connected together by the connection member; a connection member connecting all the contact pins with a predetermined distance between adjacent ones, the predetermined distance being made substantially equal to a distance between adjacent ones of terminals provided for an electrical part which is held in the socket body; and a contact pin holding member formed of an insulating resin material, the contact pin holding member holding and fixing together the conductive portion and the spring function portion and together the conductive portion and the connection leg portion.

According to this aspect, a socket for electrical parts having an improved structure and attaining a stable function can be provided by disposing a plurality of contact pin assembling structures in a laminated state.

The nature and further characteristic features of the present invention will be made more clear from the following descriptions made with reference to the accompanying drawings.

DESCRIPTION OF THE PREFERRED EMBODIMENTS

Preferred embodiments of the present invention will be described hereunder with reference to the accompanying drawings.

[First Embodiment]

Figure 1:
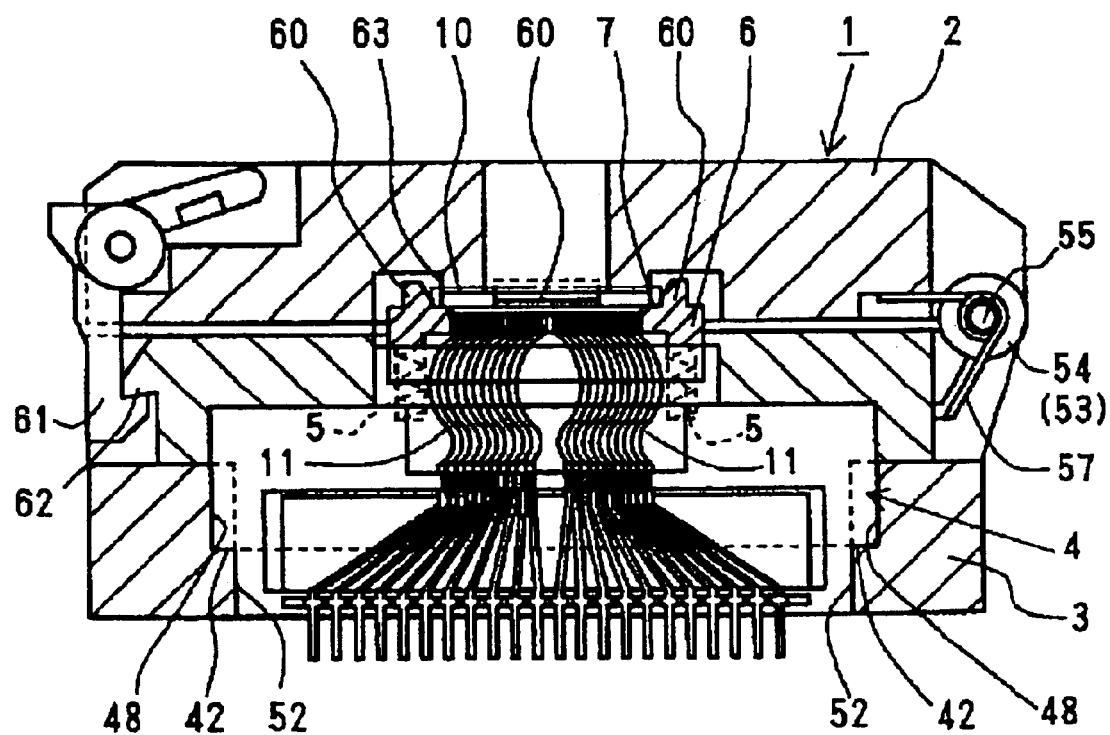
FIG. 1 is a sectional view of a socket for an electrical part according to a first embodiment of the present invention, the section being taken along the line I—I in FIG. 3 mentioned herinlater.
Figure 2:
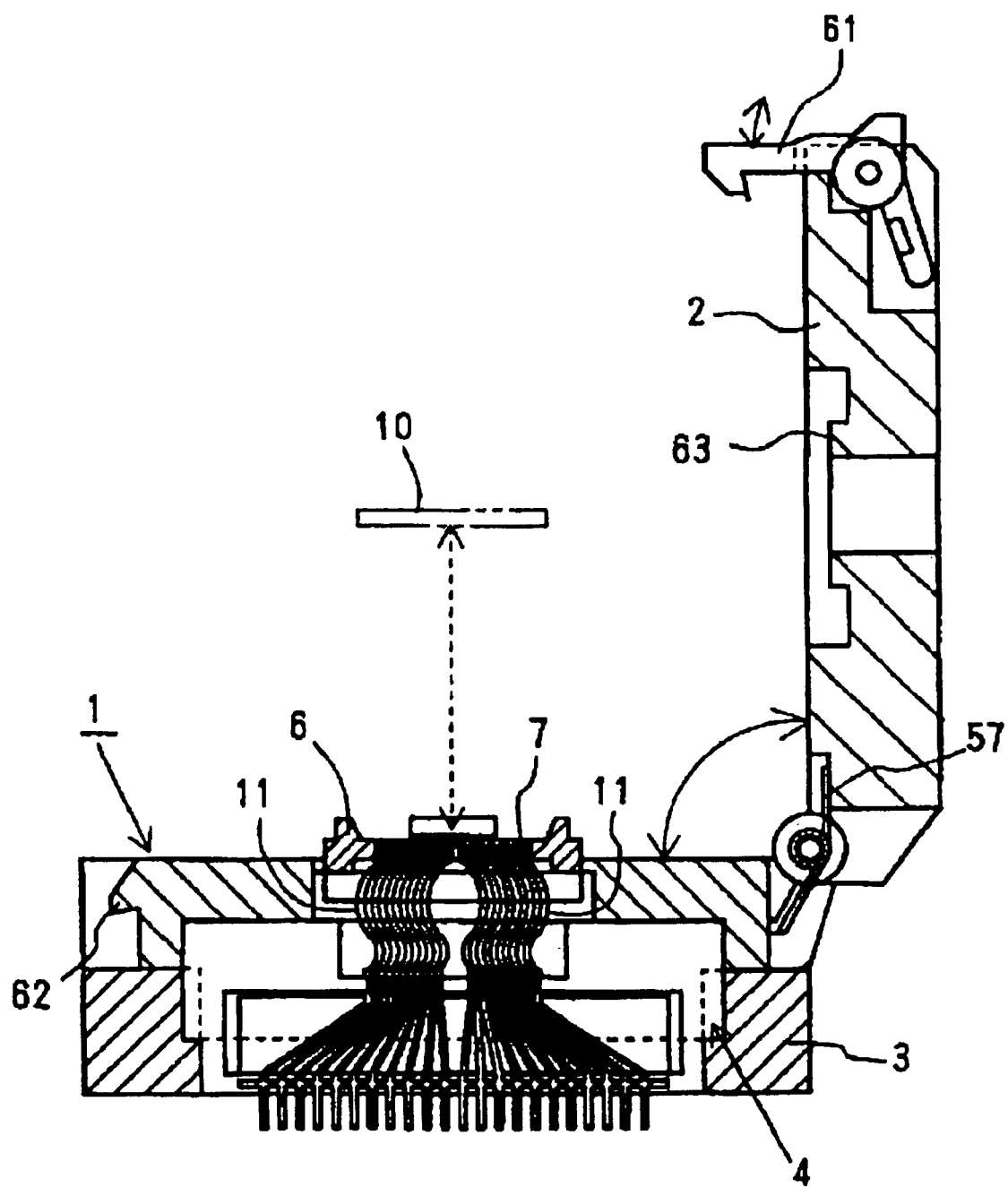
FIG. 2 is a sectional view corresponding to FIG. 1, in which a cover member is opened upward.
Figure 3:
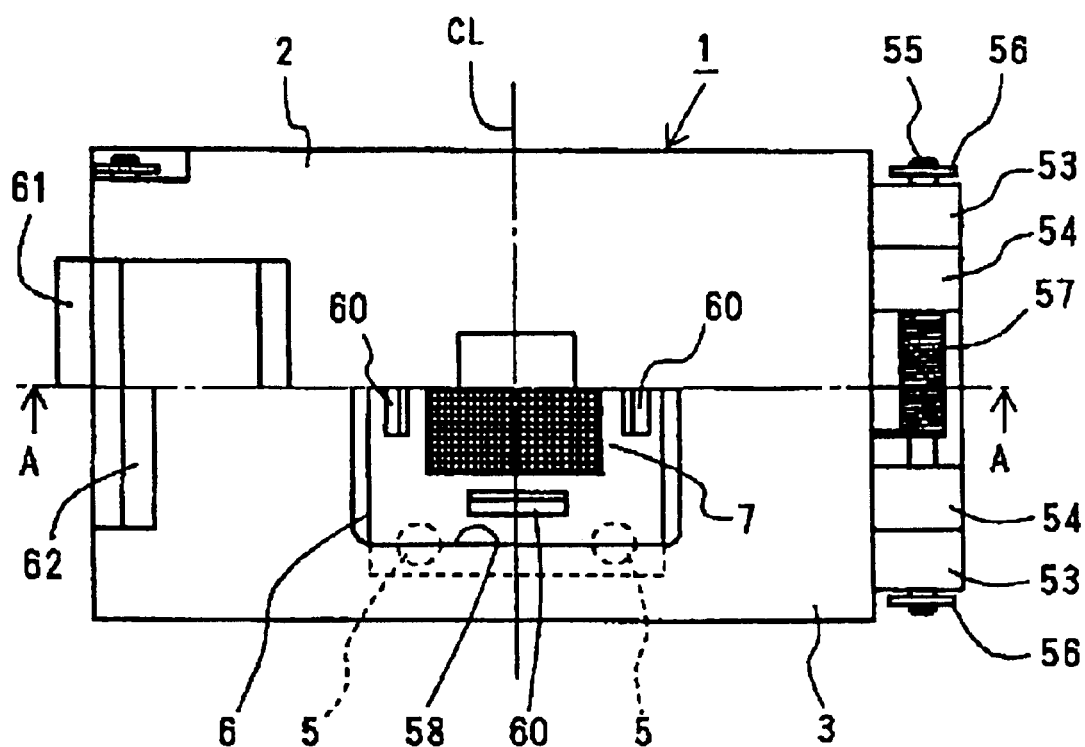
FIG. 3 is a plan view of the socket of FIG. 1, partially cut away.

FIGS. 1 to 3 represent a socket 1 for electrical parts according to the present invention, in which FIG. 1 is a sectional view of the socket with a cover 2 being closed, FIG. 2 shows the same state of the socket 1 with the cover 2 being opened and FIG. 3 is a plan view of the socket 1 including a portion partially cut away.

[Entire Structure of Socket for Electrical Parts]

With reference to these figures, the socket 1 for electrical parts comprises a socket body 3 formed of an insulating material, a cover 2 attached to an upper portion, as viewed in an installed state, of the socket body 3 to be opened or closed, a plurality of contact pin assembling structures 4 mounted to the socket body 3 and a floating plate 6 elastically supported by a spring 5 with respect to the socket body 3. In such socket 1 for electrical parts, an IC package (electrical part) 10 equipped with terminals 8 in form of matrix is accommodated in a accommodation portion 7.

Figure 4:
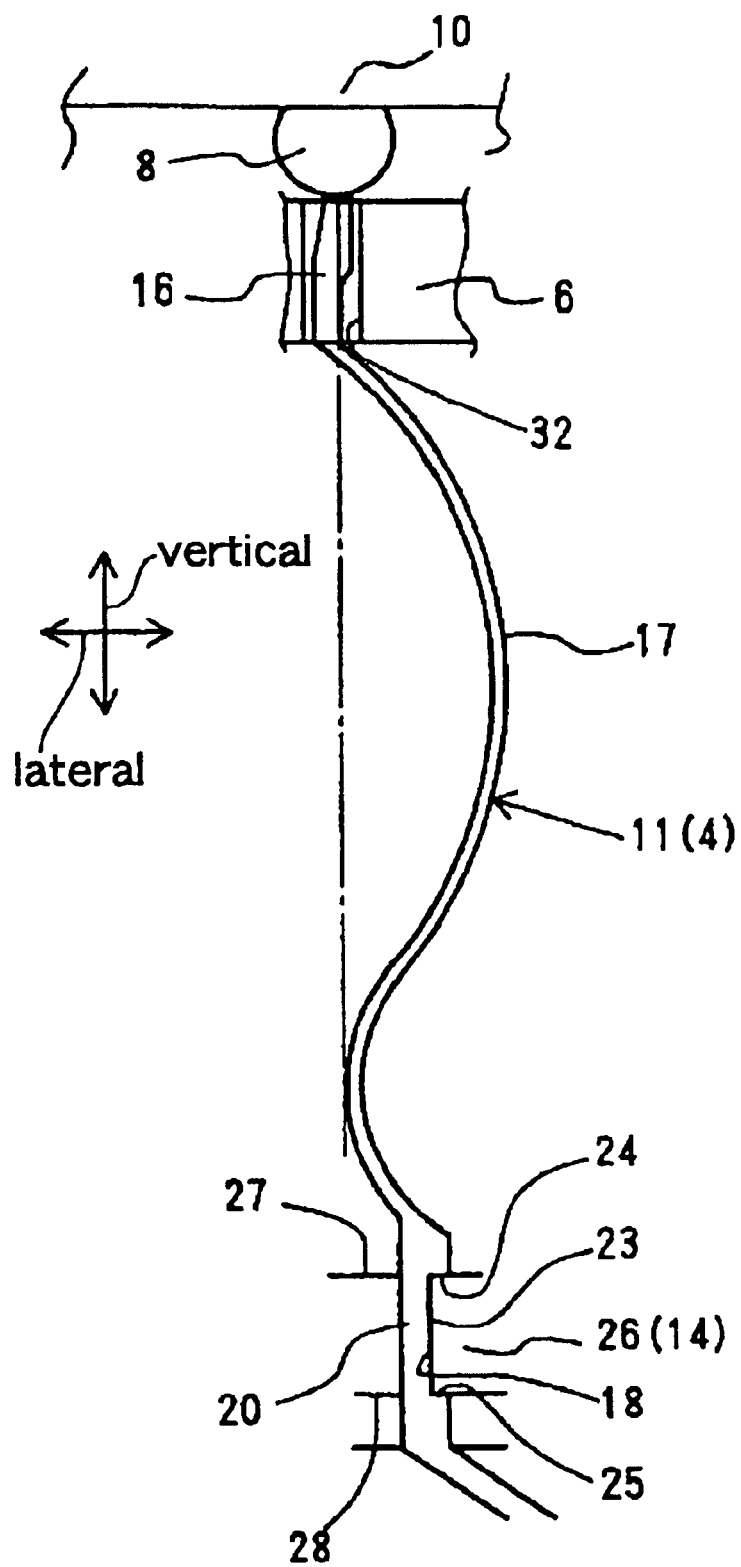
FIG. 4 is a view showing an engaged state of a contact pin and a floating plate, in an enlarged scale.
Figure 5:
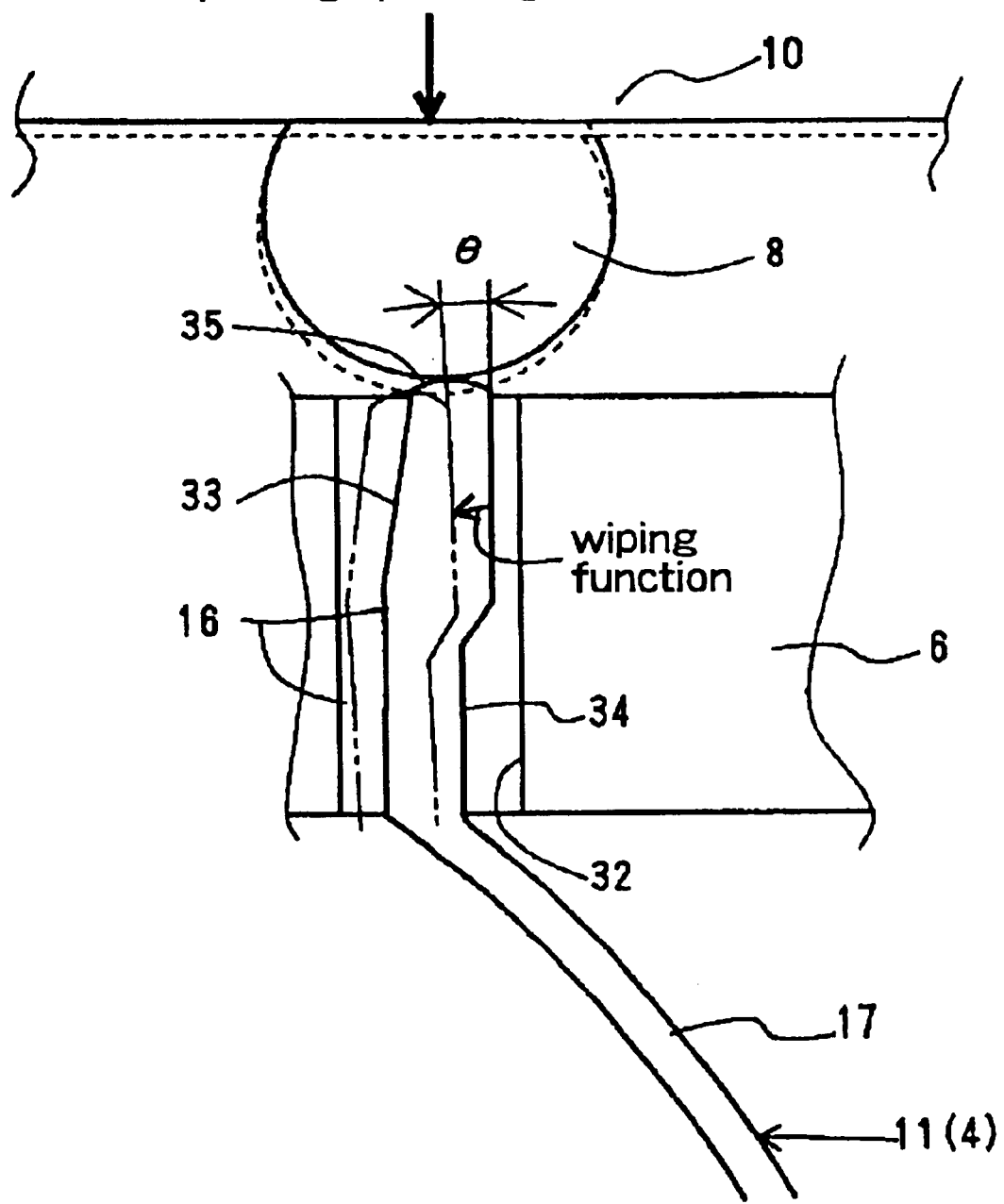
FIG. 5 is a view showing a contacting state of a terminal contact portion of the contact pin of FIG. 4 to a terminal of the electrical part, in an enlarged scale.
Figure 6A:
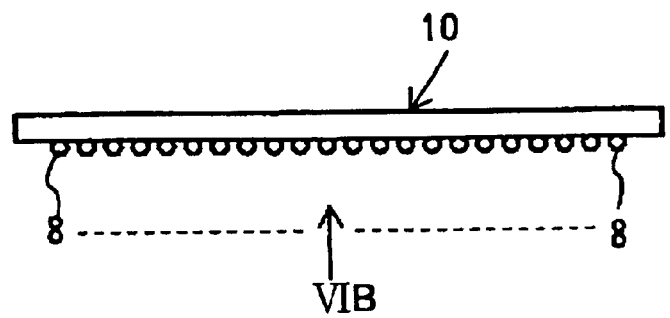
FIG. 6A is a front view of an IC package as the electrical part and FIG. 6B is a view of the IC package viewed from the direction VIB in FIG. 6A.
Figure 6B:
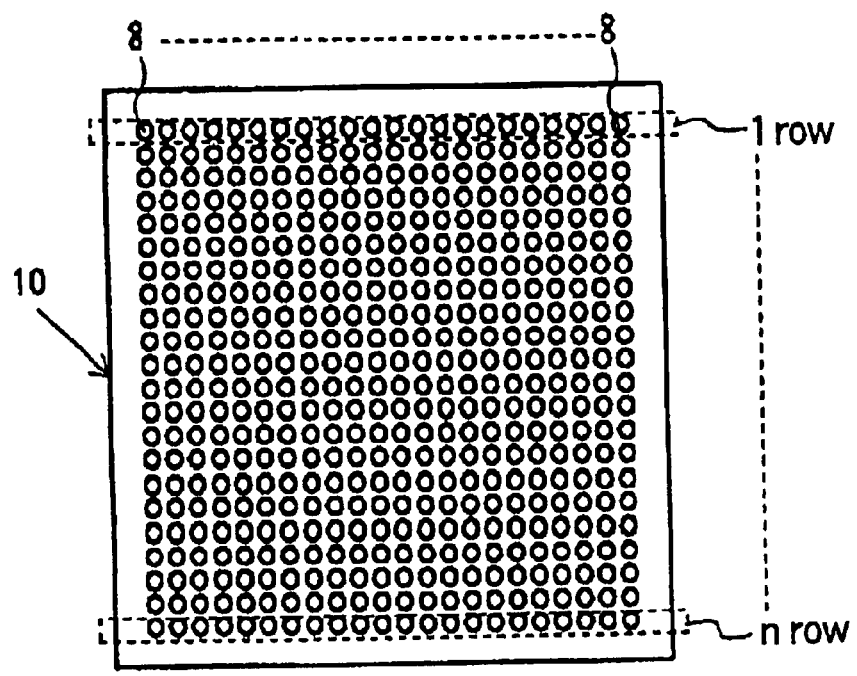

The contact pin assembling structure 4 is provided with a number of contact pins 11, through which the terminals 8 of the IC package 10 and an external test circuit means such as tester, not shown, are electrically connected to each other as shown in FIGS. 4 and 5. Further, as shown in FIG. 6A or 6B, the IC package 10 is composed of a number of terminals 8 in form of matrix.

[Contact Pin Assembling Structure]

Figure 7:
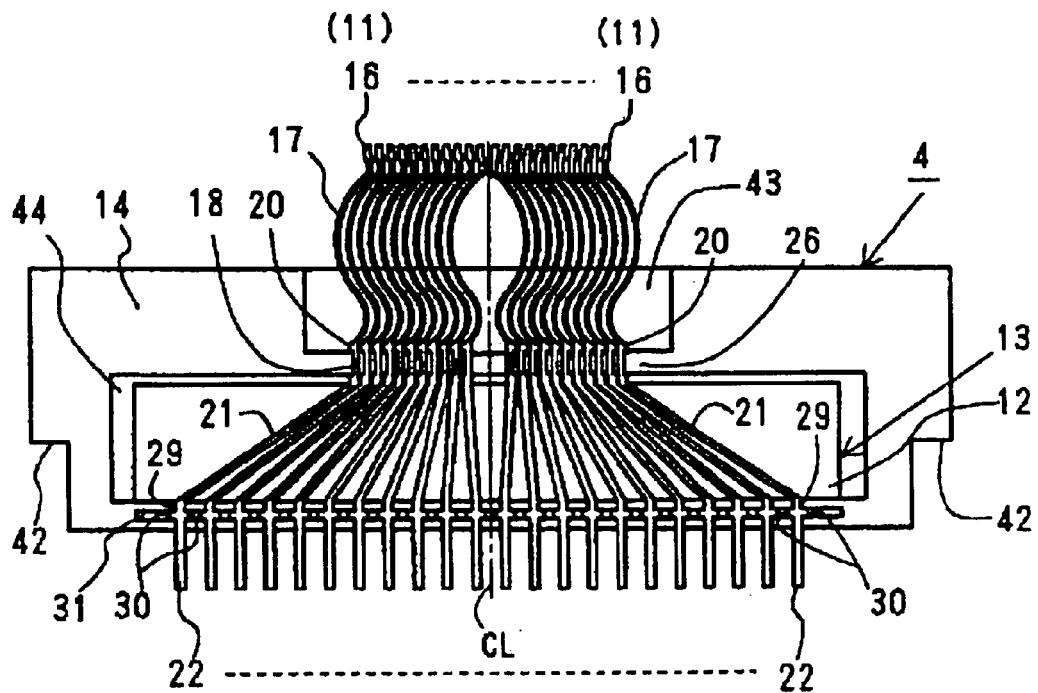
FIG. 7 is a front view of a contact pin assembly structure according to the present invention.

FIG. 7 shows a contact pin assembling structure 4 which is to be assembled with the socket body 3 and used for electrically connecting the terminals 8 of the IC-package 10 to the external test circuit means, not shown. This contact pin assembling structure 4 comprises a contact pin assembly 13 and a contact pin holding member 14 made of insulating resin (resin material having insulating property) and adapted to accommodate and hold the contact pin assembly 13. The contact pin assembly 13 comprises a number of contact pins 11 corresponding, in numbers, to one row of the terminals 8 of the IC package 10 and an insulating resin film 12, as a connection member, to which the contact pins 11 are bonded and fixed.

[Contact Pin Assembly]

Figure 8:
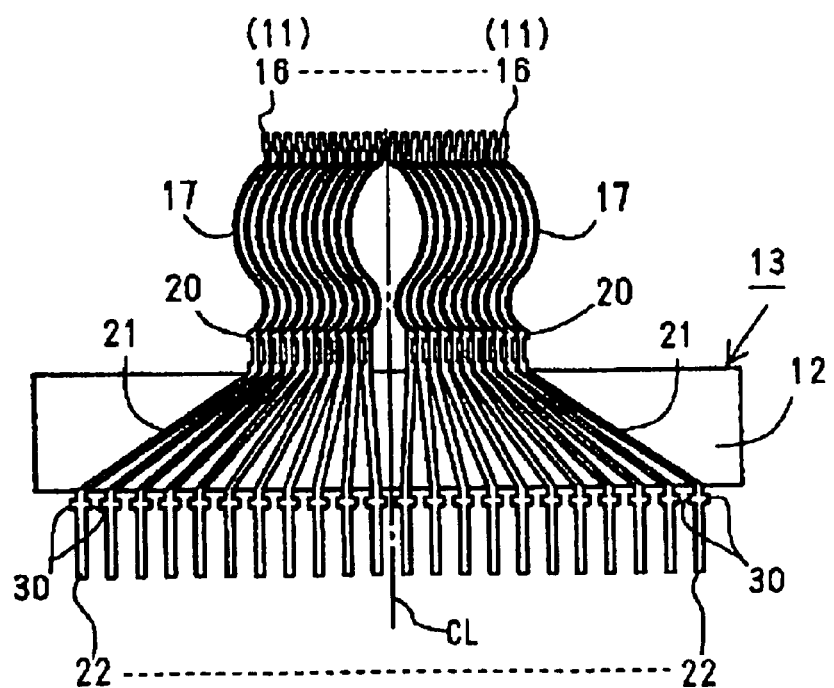
FIG. 8 is a front view of a contact pin assembly according to the present invention.

FIG. 8 shows the contact pin assembly 13, which is composed of, as mentioned above, a number of contact pins 11 corresponding, in numbers, to one row of the terminals 8 of the IC package 10 and the insulating resin film 12 for positioning and fixing the contact pins in one row.

The contact pin assembly 13 is formed in the following manner. That is, with reference to FIG. 9, the contact pin assembly 13 is formed by effecting an etching working or pressing working to an electrically conductive elastic plate so that a number of contact pins 11 corresponding, in number, to one row of the terminals 8 of the IC package 10 are connected in one assembly by means of contact pin connecting member 15 which integrally connects the lower end portions of the contact pins 11 in a fashion such that the contact pins 11 are arranged in a laterally symmetrical manner with respect to a central portion thereof (center line CL in FIG. 9).

Figure 9:
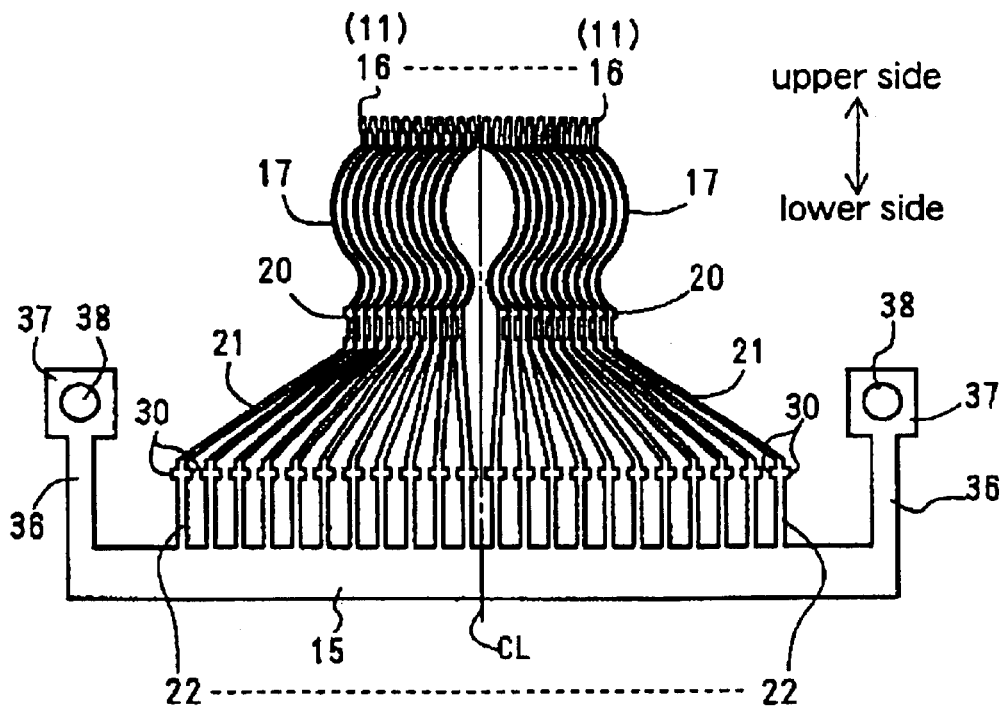
FIG. 9 is a front view showing a state that contact pins corresponding, in numbers, to one row of terminals in a matrix arrangement of an IC package are connected to other contact pins.

Each of the contact pins 11 is composed of (comprises), as shown in FIG. 4, 7 or 9, a terminal contact portion 16 contacting the terminal 8, a spring function portion 17 having approximately S- or inverted S-shape, a mount base portion 20 to be engaged with a positioning mount groove 18 formed to the contact pin holding member 14, a conductive portion 21 bonded and fixed to the insulating resin film 12 and a connection leg portion 22 for connecting the conductive portion 21 to the external electrical test circuit means.

In these structural portions or pieces, the mount base portion 20 is shown in detail. With reference to FIG. 4, the mount base portion 20 is formed with a groove 23 having an approximately rectangular, i.e. box, shape. This rectangular groove 23 has upper and lower wall sections 24, 25 and the contact pin 11 is engaged with the positioning mount groove 18 of the contact pin holding member 14 so that the wall sections 24, 25 are engaged with upper and lower wall sections 27, 28 of a positioning mount portion 26 of the contact pin holding member 14. According to such structures, the positioning of the contact pins 11 in the lateral and vertical directions can be performed.

The conductive portions 21 of the respective contact pins 11 are formed, as shown in FIG. 9, such that the lower portions thereof are gradually widened from adjacent ones towards the lower distal ends. The connection leg portions 22 are engaged with leg portion accommodation portions 29 formed to the lower end portion of the contact pin holding member 14 (see FIGS. 7, 11A and 11B). Further, engaging projections 30 are formed to the upper both side portions of the connection leg portion 22, and these engaging projections 30 are engaged with positioning grooves 31 formed to the lower end portion of the contact pin holding member 14 so as to prevent the contact pin 11 from shifting or displacing upward as viewed in FIG. 7, for example, thus contact pins being positioned and fixed.

FIG. 4 is a view of the contact pin 11 partially in an enlarged scale and FIG. 5 shows a detail of the terminal contact portion 16 of the contact pin 11 (a portion contacting the terminal of the IC package). With reference to these figures, the terminal contact portion 16 is engageable with a contact pin accommodation (receiving) hole 32 of the floating plate 6 to be vertically slidable therein, and in the case where the IC package 10 is pressed downward as viewed in FIG. 5 and the spring function portion 13 is bent and deformed, an upper end portion of one of the side surfaces is obliquely cut away to form a cutout 32 and a thickness reduced portion 34 is formed to a lower end portion of the other one of the side surfaces so as not to abut the left upper end portion or right lower end portion of the contact portion 16 against the contact pin accommodation hole 32 of the floating plate 6. As a result, as shown in FIG. 5, even if the contact pin 11 is bent and deformed by being depressed by the terminal of the IC package 10 and then displaced to a position shown with two-dot-chain line, the upper end portion and the lower end portion of the terminal contact portion 16 move along the contact pin accommodation hole 32 so as not to obstruct the smooth displacement of the contact portion 16 in the vertical direction as viewed in FIG. 5.

Furthermore, an upper end-portion 35 of the terminal contact portion 16 is formed to be round (arc-shape), so that even if the contact pin 11 is displaced from a position shown with a solid line to a portion shown with a two-dot-chain line in FIG. 5, the contact pin 11 stably contacts and slides on the surface of the terminal with maintaining substantially the same attitude of the contact pin 11 with respect to the terminal 8 to thereby scrape an oxide film adhering on the surface of the terminal 8, thus establishing an electrical contact therebetween. Further, as shown in FIG. 9, the contact pin connection portion 15 has both ends to which positioning arms 36 are formed so as to stand upward, and positioning holes 38 are formed to the front end portions 37 of the positioning arms 36, respectively.

Figure 10:
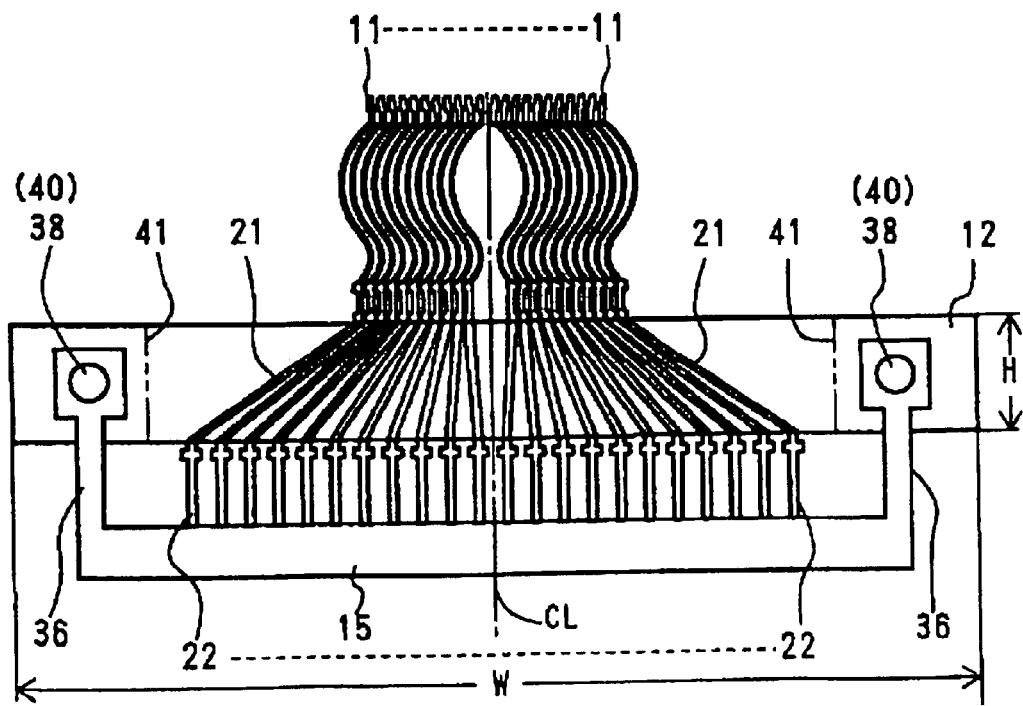
FIG. 10 is a front view showing a state that contact pins corresponding, in numbers, to one row of terminals in a matrix arrangement of an IC package are bonded and fixed to a resin film having an insulating property.

With reference to FIG. 10, the insulating resin film 12 is formed so as to have a height dimension H substantially the same as a height dimension of a conductive line (wire) portion 21a of the contact pin 11 and a width W slightly longer than a dimension between positioning arms 36, 36 of the contact pin connection portion 15, and further, a positioning hole 40 is formed to a position corresponding to the positioning hole 38 of the positioning arm 36.

Furthermore, a bonding agent is applied to a portion of the insulating resin film 12 corresponding to the conductive portion (wire-like portion) 21 of each of the contact pins 11. The contact pins 11 are bonded and fixed to the resin film 12 in a state of positional alignment of the positioning hole 40 of the insulating resin film 12 and the positioning hole 38 of the positioning arm 36 by means of positioning pin, not shown. Thereafter, the insulating resin film 12 is cut at the position shown with two-dot-chain line shown in FIG. 10 and, thereby, the contact pin connection portion 15 is cut off from the connection leg 22. According to the described manner, the respective contact pins 11 are electrically separated from each other to thereby form the contact pin assembly 13 shown in FIG. 8. The thus formed contact pin assembly 13 is assembled with the contact pin holding member 14 as shown in FIG. 7, whereby the contact pin assembling structure is constructed. Further, it is necessary for the insulating resin film 12 to be formed of a material having a resistance or durability against heat at the time of burn-in test.

(Contact Pin Holding Member)

Figure 11A:
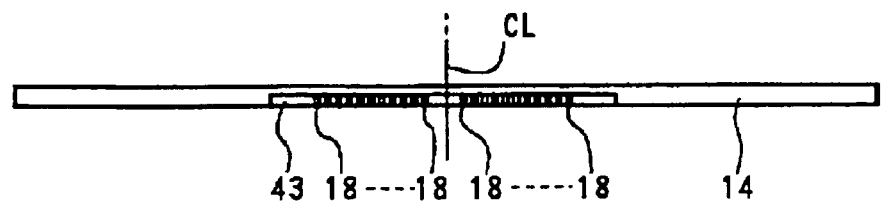
FIG. 11A is a plan view of a contact pin holding member, viewed from a direction XIA in FIG. 11B, which is a front view of the contact pin holding member.
Figure 11B:
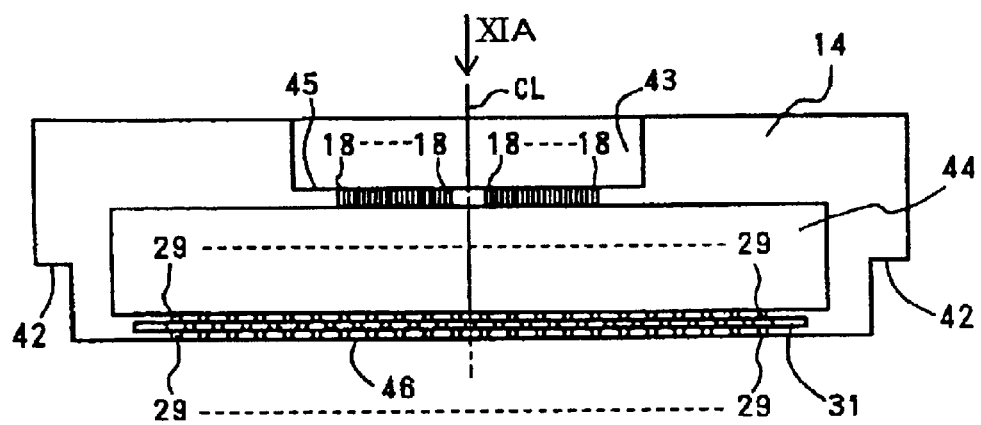

As shown in detail in FIGS. 11A and 11B, the contact pin holding member 14 is a plate-like member formed of an insulating resin and having an approximately rectangular shape provided with positioning steps 42, 42 at both lower side portions. The contact pin holding member 14 is provided with an upper recess 43 in which an upper portion of the mount base portion 20 and the spring function portion section 17 of the contact pin 11 are accommodated and a lower recess 44 in which a lower portion of the mount base portion 20 and the conductive portion 21 are accommodated together with the insulating resin film 12 in the state shown in FIG. 7.

A positioning mount portion 45 is positioned between these upper recess 43 and lower recess 44 of the contact pin holding member 14, and to this positioning mount portion 45, there are formed a plurality of positioning mount groove 18, which are engageable with the mount base section 20 of the contact pin 11 in an arrangement laterally symmetrical with respect to the center line CL.

Furthermore, a plurality of leg section accommodation grooves 29, which are engageable with the connection leg portions 22 of the contact pins 11, are formed to a lower end edge 46 of the lower recess 44 of the contact pin holding member 14, and a positioning groove 31, which is also engageable with an engaging projection 30 of the connection leg portion 22 is formed to this lower end edge of the lower recess 44. Further, the engaging groove 31 is formed so as to connect the leg portion accommodation grooves 29 in the lateral (horizontal) direction as viewed in FIG. 11B to thereby prevent the connection leg portions 22 from being shifted in the vertical direction in FIG. 11B. Further, the leg portion accommodation grooves 29 prevent the connection leg portions 22 of the contact pins 11 from being shifted in the horizontal direction.

[Socket for Electrical Parts]

Figure 12:
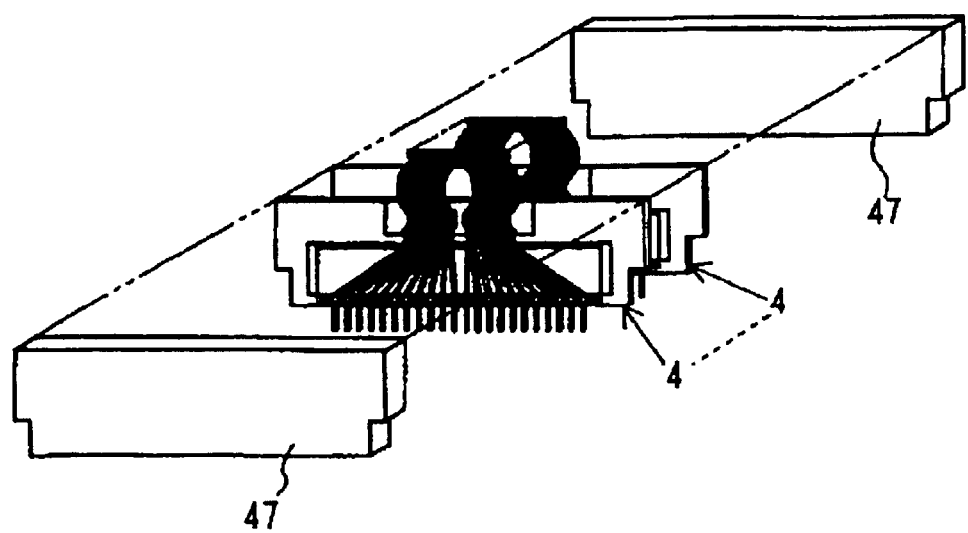
FIG. 12 is a perspective view showing a combined arrangement of the contact pin assembly structure and a press (holding) plate.
Figure 13:
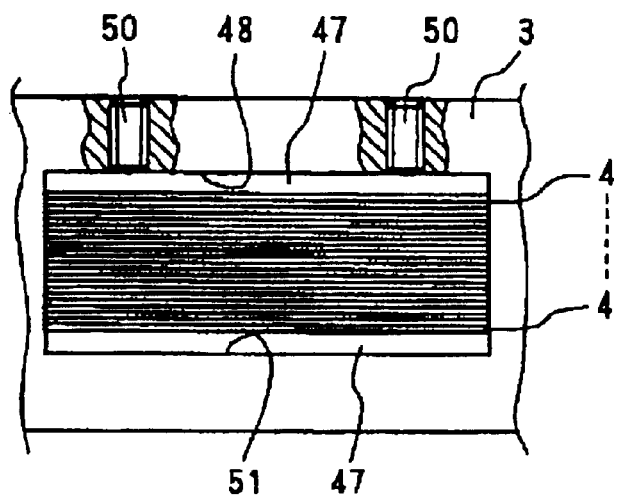
FIG. 13 is a plan view showing a state that the contact pin assembly structure, corresponding to the row numbers of the terminals of the IC package, is assembled with the socket body.

A plurality of contact pin assembling structures 4, each being formed as mentioned above, are gathered in a predetermined number corresponding to the rows (1 to n) of the terminals 8 of the IC package 10, as shown in FIGS. 12 and 13, and the assembled structures 4 are then accommodated in the contact pin assembling structure accommodation portion 48 of the socket body 3 so as to be clamped between press plates 47, 47 having high rigidity and, thereafter, fastened evenly to the positioning wall section 51 by a pair of screws 50, 50 or like. At this time, in the contact pin assembling structure 4, as shown in FIG. 1, the positioning stage 42 is engaged with a support stage 52 of the socket body 3 to thereby carry out the vertical positioning and, hence, to position the upper end portions of the contact pins 11.

With reference to FIGS. 1 to 3, a cover mount portion 53 is formed to the upper portion of the socket body 3 so as to mount the cover to be opened or closed. A support shaft (pin) 55 engaged with the shaft support portion 54 of the cover 2 is fitted to the cover mount portion 53 to be pivotal, and shaft stop rings 56 are disposed to both end portions of the support shaft 55. Furthermore, a spring 57 is disposed around the support shaft 55 in a state that one end thereof is engaged with the socket body 3 and the other end thereof is engaged with the cover to thereby always urge the cover towards its opening direction (clockwise direction in FIG. 1).

Further, with reference to FIG. 1, the floating plate 6 is accommodated in the socket body 3 at a position above substantially the central portion thereof. The floating plate 6 is urged upward by means of spring 5 and its upper position is positioned by a stopper member 58 of the socket body 3 as shown in FIG. 3. Furthermore, as shown in FIGS. 4 and 5, the floating plate 6 is provided with a plurality of contact pin accommodation (receiving) holes 32 so as to correspond, in position, to the terminals 8 of the IC package 10 so that the terminal contact portions 16 of the respective contact pins 11 are engaged with these contact pin accommodation holes 32 to be slidable.

Furthermore, the floating plate 6 is provided, as shown in FIGS. 1 and 3, with IC package positioning projections 60 at portions corresponding to four sides of the IC package 10, rectangular in a plane shape, so as to guide the IC package 10 to predetermined portions on the floating plate 6 and to position the terminals 8 of the IC package 10 with respect to the terminal contact portions 16 of the contact pins 11.

As mentioned above, the cover 2 is always urged upward, and accordingly, a hook 61 is attached to a portion opposite to the shaft support portion 54 (left side in FIG. 1) to be rotatable and the hook 61 is engaged with an engagement projection 62 of the socket body 3 to thereby close the cover 2. The cover 2 is opened, as shown in FIG. 2, by the elastic force of the spring 57 by releasing the engagement between the hook 61 and the engagement projection 62, and in this state, the IC package 10 can be set on the floating plate 6 or taken out therefrom. Furthermore, as shown in FIGS. 1 and 2, the cover 2 is formed with an IC package pressing portion 63 for pressing the IC package 10 towards the contact pins 11 against the elastic (spring) force of the spring 5.

The socket for electrical parts 1 of the structures mentioned above will operate as follows.

In the socket 1 for electrical parts, the IC package 10 is mounted to the IC accommodation portion 7 of the floating plate 6 with the cover 2 being opened, and thereafter, the cover 2 is closed to engage the hook 61 of the cover 2 with the engagement projection 62 of the socket body 3. According to this operation, the pressing portion 63 of the cover 2 depresses the IC package 10 and the floating plate 6 against the elastic force of the spring 5, thus the terminals 8 of the IC package 10 being pressed by the contact portions 16 of the contact pins 11.

Each of the contact pins 11 is contacted to the terminal 8 such that the spring function portion 17 thereof is elastically deformed and the contact portion 16 contacts the terminal 8 of the IC package while performing wiping function thereto. Thereafter, the IC package 10 is electrically connected to the external electrical test device through the contact pins 11, thus performing the electrical test of the IC package 10. Upon the completion of the electrical test, the engagement between the hook 61 of the cover 2 and the engagement projection 62 of the socket body 3 is released. According to this operation, the cover 2 is rotated to the position of FIG. 2 from the position of FIG. 1 and then separated from the upper surface of the socket body 3. In this positional state, the IC package 10 after the electrical testing is taken out from the floating plate 6 and a new IC package 10 is mounted on the floating plate 6.

The functions and effects of the socket 1 for electrical parts according to the described embodiment will be described hereunder.

In the socket 1 for electrical parts of this embodiment, since the contact pins 11 of the numbers corresponding to one row of the terminals 8 arranged in matrix are positioned and fixed integrally to the insulating resin film 12, the contact pins 11 for one row of the terminals 8 can be easily assembled to the contact pin holding member 14 for a worker by adjusting the position of the insulating resin film 12 with respect to the contact pin holding member 14, and the assembling steps and working can be remarkably reduced in comparison with a case in which the contact pins 11 are engaged with the contact pin holding member 14 one by one.

Furthermore, in the socket 1 for electrical parts of the described embodiment, the contact pin assembly 13 of the structure mentioned above is assembled with the contact pin holding member 14 to thereby construct the contact pin assembling structure 4, and the plural contact pin assembling structure 4 corresponding, in numbers, to the rows (1 to n) of the terminals 8 of the IC package 10 are assembled to the socket body 3. Therefore, the assembling steps and working can be remarkably reduced in comparison with a case in which the contact pins 11 are directly assembled to the socket body 3 one by one and the shape of the socket body 3 can be made simple.

Still furthermore, in the described embodiment, the contact pin 11 has the spring function portion 17 in form of substantially S-shape or inverted S-shape, so that this portion is easily bent and deformed in comparison with a spring function portion which merely has an arcuate shape, and hence, the contact portion 16 is less tilted (i.e., an inclination θ in the vertical direction in FIG. 5). Accordingly, it is possible for the spring function portion 17 of the present invention to have a large displacement in flexibility in comparison with a spring function portion merely having an arcuate shape, which results in easy absorption of an error in performances in forming and/or assembling the respective members and portions of the socket 1 for electrical parts, and hence, the socket 1 can be easily designed and manufactured. Furthermore, since the contact portion 16 of the contact pin 11 has a small inclination (tilting) in attitude, the contacting state between the contact portion 16 and the terminal 8 can be made stable.

Still furthermore, the contact pin assembly 13 of this embodiment has a laterally symmetrical arrangement with respect to its central position as shown in FIG. 8, so that the contact pins 11 are deformed laterally symmetrically with respect to the center line CL at the time when the IC package 10 is pressed. As a result, the IC package 10 becomes free from the shifting in the lateral direction in FIG. 8 by the contact pins 11 and hence smoothly moves in the vertical direction. Accordingly, the contact portions 16 of the contact pins 11 suitably perform the wiping function to the terminals 8 of the IC package 10 and the electrical contact between the contact pins 11 and the IC package 10 can be ensured.

Further, it is to be noted that, in an arrangement in which all the contact pins are displaced in the same direction, the IC package 10 are displaced in the same direction together with the terminal contact portions 16 of the contact pins 11. Thus, in such arrangement, different from that mentioned above of the present invention, sufficient wiping effect could not be attained between the terminals 8 of the IC package 10 and the terminal contact portions 16 of the contact pins 11.

Still furthermore, in the described embodiment, since the contact pins 11 corresponding, in numbers, to one row of the terminals 8 of the IC package 10 are manufactured from an electrically conductive elastic plate through an etching process or press working, the contact pins 11 can be easily manufactured particularly in comparison with the first example of the prior art, thus reducing the manufacturing cost thereof.

Still furthermore, in the described embodiment, since the contact pins 11 corresponding, in numbers, to one row of the terminals 8 of the IC package 10 are manufactured from an electrically conductive elastic plate through an etching process or press working, the contact pins 11 can be easily manufactured with reduced distance between adjacent ones in arrangement, it becomes possible to carry out the electrical test of the IC package having extremely narrow pitch distance between the respective terminals 8, which was difficult for the conventional technology such as first and second prior arts mentioned hereinbefore.

In the socket 1 for electrical parts of the described embodiment, if the bonding and fixing force of the insulating resin film 12 to the contact pins 11 is sufficiently large and the postioning and holding of the contact pins 11 can be done only by the insulating resin film 12, it will be not necessary to form the positioning groove 18, the leg portion accommodation groove 29 and the positioning groove 31 may not be formed to the contact pin holding member 14, and hence, the shape of the contact pin holding member 14 will be made compact, which results in the easy engagement between the contact pin holding member 14 and the contact pin assembly 13, enabling the socket 1 to be more easily assembled with reduced labour and cost.

In the described embodiment, the surface of the conductive wire portion of the contact pin assembly 13 may be coated with an insulating resin material to make further sure the insulation between the respective contact pins 11.

[Second Embodiment]

Figure 14:
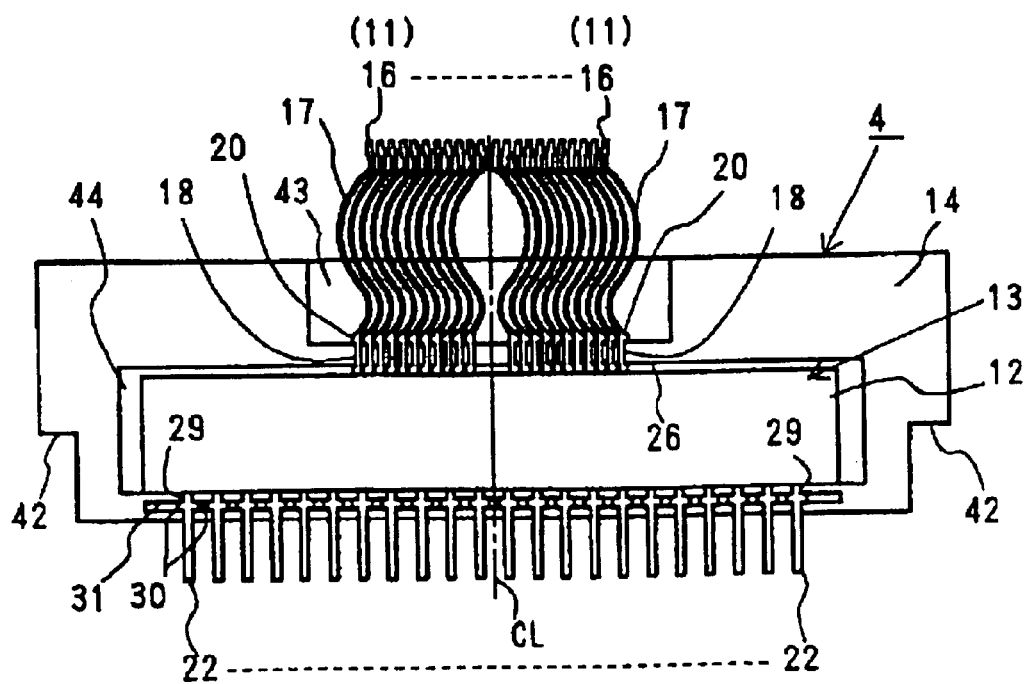
FIG. 14 is a front view of a contact pin assembly structure according to a second embodiment of the present invention.
Figure 15:
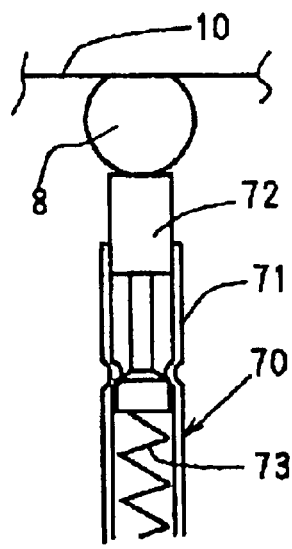
FIG. 15 shows a structure of a contact pin according to a first prior art.
Figure 16:
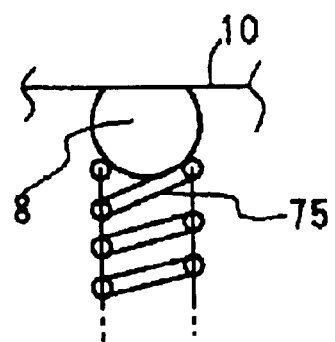
FIG. 16 shows a structure of a contact pin according to a second prior art.

FIG. 14 represents a second embodiment of the present invention, which corresponds to the state shown in FIG. 7 and in which like reference numerals are added to portions and members corresponding to those of the first embodiment and duplicated explanation is hence omitted herein.

With reference to FIG. 14, in this second embodiment, the contact pin assembly 13 is engaged with the contact pin holding member 14 so that the insulating resin film 12 is positioned to the front surface side. The mount base portions 20 of the respective contact pins 11 of the contact pin assembly 13 are engaged with the positioning mount grooves 18 of the contact pin holding member 14, respectively, and the connection leg portions 22 and engagement projections 30 of the contact pins 11 are respectively engaged with the leg portion accommodation grooves 29 and the positioning grooves 31, thereby surely positioning and fixing the contact pins 11 to the contact pin holding member 14. Thereafter, the insulating resin film 12 is peeled from the contact pins 11, thus constructing the contact pin assembling structure 4. Then, the contact pin assembling structure 4 is assembled to the socket body 3 as like as in FIG. 13.

In the described second embodiment, an adhesive tape will be preferably utilized as bonding means for bonding and fixing the contact pins 11 corresponding to single row of the terminals of the IC package 10, and the bonding means is peeled from the contact pins 11 before the assembling to the socket body 3, so that paper tape and other heat-resistant tape or film having no insulating property may be instead utilized other than the insulating resin film 12 in the first embodiment.

Further, in this second embodiment, as like as in the first embodiment, the assembling steps or workings for the socket for electrical parts can be also reduced and a socket having simple shape and size can be realized.

It is further to be noted that the present invention is not limited to the described embodiments and many other changes and modifications may be made without departing from the scope of the appended claims.

What is claimed is:

1. A method of manufacturing a contact pin assembly which comprises a plurality of contact pins and a connection member connecting all the contact pins, the manufacturing method comprising:

forming a plurality of contact pins and contact pin connection portions integrally from a conductive elastic plate member;

arranging and fixing the contact pins by using the connection member with a predetermined distance between adjacent contact pins; and removing thereafter the contact pin connection portions from the respective contact pins.

2. A method as in claim 1, wherein said forming comprises etching the conductive elastic plate member to form the contact pins with the contact pin connection portions.

3. A method as in claim 1, wherein said forming comprises punching out the conductive elastic plate member to form the contact pins with the contact pin connection portions.

4. A method as in claim 1, wherein the connection member is made of a resin film having a resistance or durability against heat at a time of burn in test.

5. A method as in claim 1, wherein said fixing comprises bonding using a bonding agent applied on a resin film.

6. A method comprising:

forming a plurality of contact pins and contact pin connection portions integrally from a conductive elastic plate member;

arranging and fixing the contact pins by using the connection member with a predetermined distance between adjacent contact pins; and removing thereafter the contact pin connection portions from the respective contact pins, wherein the contact pins and the connection member are included in a contact pin assembly.

7. The method as in claim 6, wherein said forming comprises etching the conductive elastic plate member to form the contact pins with the contact pin connection portions.

8. A method as in claim 6, wherein said forming comprises punching out the conductive elastic plate member to form the contact pins with the contact pin connection portions.

9. A method as in claim 6, wherein the connection member is made of a resin film having a resistance or durability against heat at a time of burn in test.

10. A method as in claim 6, wherein said fixing comprises bonding using a bonding agent applied on a resin film.

11. A method of manufacturing a contact pin assembly structure comprising a plurality of contact pins and a contact pin holding member holding the contact pins, each of the contact pins comprising a spring function portion having elasticity, a contact portion formed to a top end side of the spring function portion and contacting a terminal of an electrical part, a conductive portion extending from the spring function portion on a side opposite to the contact portion, and a connection leg portion further extending from the conductive portion, the method comprising:

forming a plurality of contact pins and contact pin connection portions integrally from a conductive elastic plate member;

arranging and fixing the contact pins by using a connection member with a predetermined distance between adjacent contact pins;

removing the contact pin connection portions from the contact pins;

fixing a first portion between the conductive portion and the spring function portion and a second portion between the conductive portion and the connection leg portion of each contact pin to a contact pin holding member made of an insulting resin; and then removing the connection member from the conductive portions of the contact pins.

12. A method as in claim 11, wherein said forming comprises etching the conductive elastic plate member to form the contact pins with the contact pin connection portions.

13. A method as in claim 11, wherein said forming comprises punching out the conductive elastic plate member to form the contact pins with the contact pin connection portions.

14. A method as in claim 11, wherein the connection member is made of a resin film having a resistance or durability against heat at a time of burn in test.

15. A method as in claim 11, wherein said fixing comprises bonding using a bonding agent applied on a resin film.

16. An apparatus for manufacturing a contact pin assembly which comprises a plurality of contact pins and a connection member connecting all the contact pins, the apparatus comprising:

- means for forming a plurality of contact pins and contact pin connection portions integrally from a conductive elastic plate member;
- means for arranging and fixing the contact pins by using the connection member with a predetermined distance between adjacent contact pins; and
- means for removing thereafter the contact pin connection portions from the respective contact pins.

17. An apparatus as in claim 16, wherein said means for forming comprises means for etching the conductive elastic plate member to form the contact pins with the contact pin connection portions.

18. An apparatus as in claim 16, wherein said means for forming comprises means for punching out the conductive elastic plate member to form the contact pins with the contact pin connection portions.

19. An apparatus as in claim 16, wherein the connection member is made of a resin film having a resistance or durability against heat at a time of burn in test.

20. An apparatus as in claim 16, wherein said means for arranging and fixing comprises means for bonding using a bonding agent applied on a resin film.

21. An apparatus comprising:

- means for forming a plurality of contact pins and contact pin connection portions integrally from a conductive elastic plate member;
- means for arranging and fixing the contact pins by using the connection member with a predetermined distance between adjacent contact pins; and
- means for removing thereafter the contact pin connection portions from the respective contact pins, wherein the contact pins and the connection member are included in a contact pin assembly.

22. An apparatus as in claim 21, wherein said means for forming comprises etching the conductive elastic plate member to form the contact pins with the contact pin connection portions.

23. An apparatus as in claim 21, wherein said means for forming comprises punching out the conductive elastic plate member to form the contact pins with the contact pin connection portions.

24. An apparatus as in claim 21, wherein the connection member is made of a resin film having a resistance or durability against heat at a time of burn in test.

25. An apparatus as in claim 21, wherein said means for arranging and fixing comprises bonding using a bonding agent applied on a resin film.

* * * * *